US011355646B2

(12) United States Patent
Kim et al.

(10) Patent No.: US 11,355,646 B2
(45) Date of Patent: Jun. 7, 2022

(54) THIN FILM TRANSISTOR, GATE DRIVER INCLUDING THE SAME, AND DISPLAY DEVICE INCLUDING THE SAME

(71) Applicant: LG Display Co., Ltd., Seoul (KR)

(72) Inventors: Seung-Jin Kim, Seoul (KR); Jee-Ho Park, Seoul (KR); Seo-Yeon Im, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 17/083,999

(22) Filed: Oct. 29, 2020

(65) Prior Publication Data

US 2021/0135014 A1     May 6, 2021

(30) Foreign Application Priority Data

Oct. 30, 2019    (KR) .......................... 10-2019-0136978

(51) Int. Cl.
| | | |
|---|---|---|
| *H01L 29/786* | (2006.01) | |
| *G09G 3/32* | (2016.01) | |
| *H01L 29/24* | (2006.01) | |
| *H01L 27/12* | (2006.01) | |
| *H01L 29/66* | (2006.01) | |
| *G09G 3/3225* | (2016.01) | |
| *G09G 3/3266* | (2016.01) | |

(Continued)

(52) U.S. Cl.
CPC ..... *H01L 29/78693* (2013.01); *G09G 3/3225* (2013.01); *G09G 3/3266* (2013.01); *H01L 27/1225* (2013.01); *H01L 29/247* (2013.01); *H01L 29/66969* (2013.01); *H01L 29/78696* (2013.01); *G09G 2300/0809* (2013.01); *H01L 21/465* (2013.01); *H01L 27/3244* (2013.01); *H01L 29/42384* (2013.01); *H01L 29/78633* (2013.01)

(58) Field of Classification Search
CPC ........... H01L 29/78693; H01L 27/1225; H01L 27/3244; H01L 29/247; H01L 29/42384; H01L 29/78633; H01L 29/78696; G09G 3/32; G09G 3/3225; G09G 3/36; G09G 3/3266; G09G 2300/0809
See application file for complete search history.

(56) References Cited

U.S. PATENT DOCUMENTS

| | | | | |
|---|---|---|---|---|
| 9,136,389 B2* | 9/2015 | Yamazaki | ......... | H01L 29/78618 |
| 2014/0138674 A1* | 5/2014 | Sato | .................. | H01L 21/02631 |
| | | | | 257/43 |

(Continued)

FOREIGN PATENT DOCUMENTS

| | | |
|---|---|---|
| JP | 2009-235438 A | 10/2009 |
| KR | 10-2015-0034947 A | 4/2015 |
| KR | 10-2015-0079331 A | 7/2015 |

*Primary Examiner* — Pegeman Karimi
(74) *Attorney, Agent, or Firm* — Morgan, Lewis & Bockius LLP

(57) ABSTRACT

Disclosed are a thin film transistor having an oxide semiconductor layer which is applicable to a flat display device requiring high-speed driving due to ultra-high definition, a gate driver including the same, and a display device including the same. The thin film transistor includes a first oxide semiconductor layer formed of iron-indium-zinc oxide (FIZO) and a second oxide semiconductor layer formed of indium-gallium-zinc oxide (IGZO), thus being capable of exhibiting effects, such as high reliability and high electron mobility.

18 Claims, 13 Drawing Sheets

(51) Int. Cl.
  *H01L 29/423*   (2006.01)
  *H01L 21/465*   (2006.01)
  *H01L 27/32*    (2006.01)

(56) References Cited

U.S. PATENT DOCUMENTS

| | | | |
|---|---|---|---|
| 2015/0091004 A1 | 4/2015 | Kim et al. | |
| 2017/0040457 A1* | 2/2017 | Okazaki | H01L 29/7853 |
| 2017/0243525 A1* | 8/2017 | Morikawa | H05B 33/04 |
| 2017/0302271 A1* | 10/2017 | Kato | G11C 5/025 |
| 2017/0352763 A1* | 12/2017 | Yamazaki | H01L 29/7869 |
| 2018/0350995 A1* | 12/2018 | Kim | H01L 29/24 |

* cited by examiner

FIG. 14

|  | IZO | FIZO |
|---|---|---|
| Room Temperature | Crystalline | Amorphous |
| High Temperature | Crystalline | Crystalline |

FIG. 15

|  | Crystallinity of first oxide semiconductor layer (FIZO) | Etching rate of oxide semiconductor layer |
|---|---|---|
| Room Temperature | Amorphous | Bi-layer |
| High Temperature | Crystalline | Bi-layer |

THIN FILM TRANSISTOR, GATE DRIVER INCLUDING THE SAME, AND DISPLAY DEVICE INCLUDING THE SAME

This application claims the benefit of Korean Patent Application No. 10-2019-0136978, filed on Oct. 30, 2019, which is hereby incorporated by reference as if fully set forth herein.

BACKGROUND OF THE INVENTION

Field of the Invention

The present invention relates to a thin film transistor, a gate driver including the same, and a display device including the same.

Discussion of the Related Art

With the advancement of the information-oriented society, various demands for display devices which display images are being increased. Accordingly, various display devices, such as a liquid crystal display (LCD) device, a plasma display panel (PDP) device and a light emitting display (LED) device, are being used now. Light emitting display devices include an organic light emitting diode display device using organic light emitting diodes as light emitting elements and a light emitting diode display device using micro light emitting diodes as light emitting elements.

Recently, a flat display device which may display an image at an ultra-high definition (UHD) is on the market. The UHD flat display device requires driving at a high speed, and thereby, an one-line scanning time which is a time taken to supply a gate signal to one gate line is shortened. The one-line scanning time corresponds to a data voltage supply period of a pixel. Therefore, when the one-line scanning time is shortened, the pixel may not be charged with a desired data voltage, thereby being capable of causing deterioration in image quality.

In order to prevent such a problem, an oxide semiconductor layer of a thin film transistor which is applicable to the UHD flat display device requiring high-speed driving must have high electron mobility and be implemented as a short channel due to high pixels per inch (PPI).

Therefore, a thin film transistor including an oxide semiconductor layer, which may be manufactured through a simple process and be applied to the UHD flat display device requiring high-speed driving, is required.

SUMMARY OF THE INVENTION

Accordingly, the present invention is directed to a thin film transistor, a gate driver including the same, and a display device including the same that substantially obviate one or more problems due to limitations and disadvantages of the related art.

An object of the present invention is to provide a thin film transistor having an oxide semiconductor layer applicable to an ultra-high definition (UHD) flat display device requiring high-speed driving, a gate driver including the same, and a display device including the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor includes a first oxide semiconductor layer formed of iron-indium-zinc oxide (FIZO), and a second oxide semiconductor layer formed of an oxide including at least one of indium (In), gallium (Ga) or zinc (Zn).

The thin film transistor may include the first oxide semiconductor layer formed of iron-indium-zinc oxide (FIZO), and the second oxide semiconductor layer formed of indium-gallium-zinc oxide (IGZO) including indium (In), gallium (Ga) and zinc (Zn).

A content ratio of iron (Fe) to indium (In) (Fe/In) in the first oxide semiconductor layer may be smaller than a content ratio of zinc (Zn) to indium (In) (Zn/In) in the first oxide semiconductor layer.

A content of indium (In) in the first oxide semiconductor layer may be greater than a content of zinc (Zn) in the first oxide semiconductor layer.

The content of zinc (Zn) in the first oxide semiconductor layer may be greater than a content of iron (Fe) in the first oxide semiconductor layer and smaller than the content of indium (In) in the first oxide semiconductor layer.

A content ratio of zinc (Zn) to indium (In) (Zn/In) in the second oxide semiconductor layer of the thin film transistor may be greater than a content ratio of zinc (Zn) to indium (In) (Zn/In) in the first oxide semiconductor layer.

Resistance and band-gap energy of the second oxide semiconductor layer may be greater than resistance and band-gap energy of the first oxide semiconductor layer, and the band-gap energy of the second oxide semiconductor layer may be within a range of 105% to 130% of the band-gap energy of the first oxide semiconductor layer.

An inclination of one side surface of the first oxide semiconductor layer may be formed at an acute angle, and an inclination of one side surface of the second oxide semiconductor layer may be formed at a right angle or an an acute angle.

A source electrode and a drain electrode may cover side surfaces of the first oxide semiconductor layer and side surfaces of the second oxide semiconductor layer.

In another aspect of the present invention, a gate driver includes a plurality of stages configured to output gate signals, wherein each of the stages includes the thin film transistor.

In yet another aspect of the present invention, a display device includes a display panel including data lines, gate lines, and pixels arranged in intersection regions between the data lines and the gate lines, wherein each of the pixels includes the thin film transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 14 illustrates property analysis images of first oxide semiconductor layers formed of IZO and FIZO depending on the temperature of the first substrate when the first oxide semiconductor layers are deposited;

FIG. 15 illustrates images showing the crystallinity and cross-section of the first oxide semiconductor layer formed of FIZO depending on the temperature of the first substrate when the first oxide semiconductor layer is deposited;

DETAILED DESCRIPTION OF THE INVENTION

Figure 1:
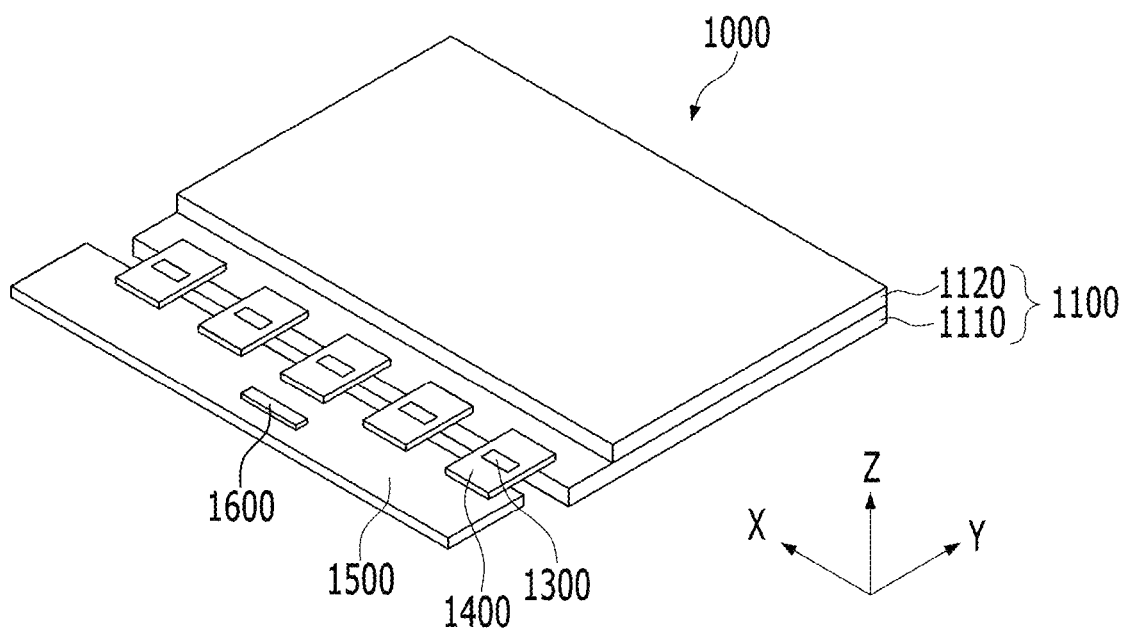
FIG. 1 is a perspective view illustrating a display device according to one embodiment of the present invention.

In the following description of the embodiments of the present invention, like reference numerals in various drawings indicate like elements throughout the specification. In the following description of the embodiments of the present invention, a detailed description of known functions and configurations incorporated herein will be omitted when it may make the subject matter of the present invention rather unclear. Further, the names of elements used in the following description of the embodiments of the present invention are selected in consideration of ease in preparation of the specification, and may thus differ from the names of parts of an actual product.

Advantages and features of the present invention and methods for achieving the same will become apparent from the descriptions of aspects herein below with reference to the accompanying drawings. However, the present invention is not limited to the aspects disclosed herein and may be implemented in various different forms. The aspects are provided to make the description of the present invention thorough and to fully convey the scope of the present invention to those skilled in the art. It is to be noted that the scope of the present invention is defined only by the claims.

The shapes, sizes, ratios, angles, the number of elements given in the drawings are merely exemplary, and thus, the present invention is not limited to the illustrated details.

In the interpretation of elements included in the various embodiments of the present invention, it will be interpreted that the elements include error ranges even if there is no clear statement.

Characteristics of the various embodiments of the present invention may be partially or entirely connected to or combined with each other and technically variously driven and interlocked with each other, and the respective embodiments may be independently implemented or be implemented together in connection with each other.

Reference will now be made in detail to the exemplary embodiments of the present invention, examples of which are illustrated in the accompanying drawings.

Although a display device according to one embodiment of the present invention will be described as a light emitting display device, the embodiments of the present invention are not limited hereto. That is, the display device according to one embodiment of the present invention may be implemented as one of a liquid crystal display (LCD) device, a light emitting display device, a field emission display device and an electrophoretic display device. Light emitting display devices include an organic light emitting diode display device using organic light emitting diodes as light emitting elements and a light emitting diode display device using micro light emitting diodes as light emitting elements.

Figure 2:
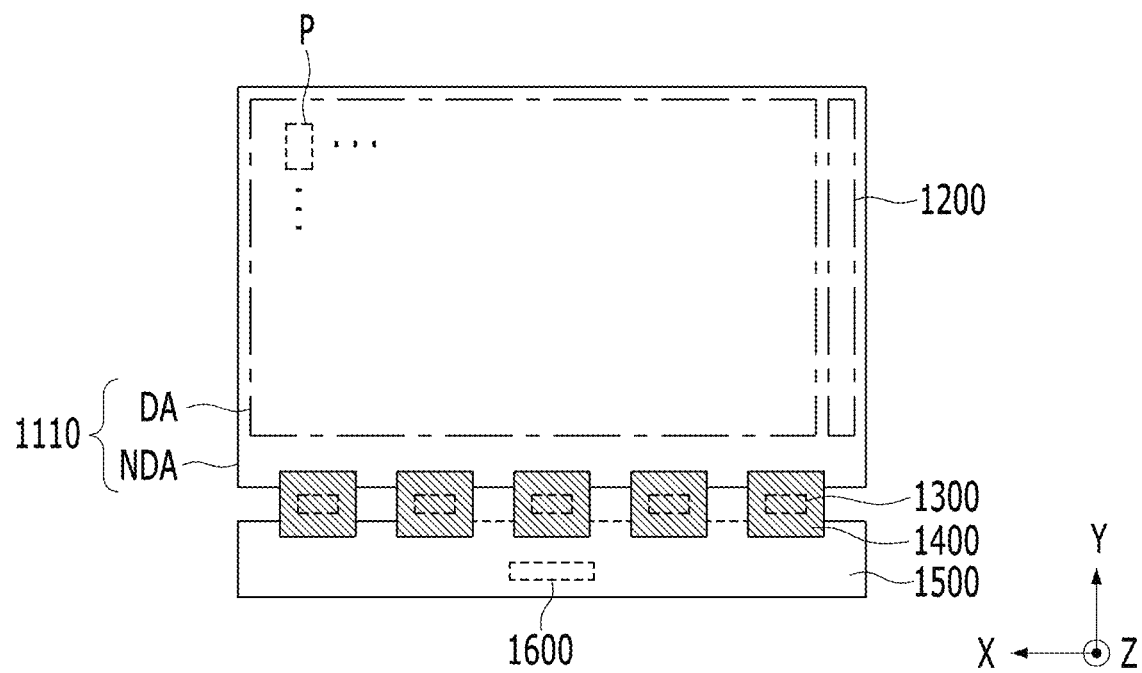
FIG. 2 is a plan view illustrating a first substrate, a gate driver, a source driver IC, a flexible film, a circuit board and a timing controller of FIG. 1.

FIG. 1 is a perspective view illustrating a display device according to one embodiment of the present invention, and FIG. 2 is a plan view illustrating a first substrate, a gate driver, a source driver IC, a flexible film, a circuit board and a timing controller of FIG. 1.

Referring to FIGS. 1 and 2, an organic light emitting display device 1000 according to one embodiment of the present invention includes a display panel 1100, a gate driver 1200, a data driver, a flexible film 1400, a circuit board 1500 and a timing controller 1600.

The display panel 1100 includes a first substrate 1110 and a second substrate 1120. The first substrate 1110 and the second substrate 1120 may be formed of glass or plastic. For example, if the first substrate 1110 is formed of plastic, the first substrate 1110 may be formed of polyimide, polyethylene terephthalate (PET), polyethylene naphthalate (PEN) or polycarbonate (PC). If the first substrate 1110 is formed of plastic, the organic light emitting display device 1000 may be implemented as a flexible display device which is bendable or foldable. The second substrate 1120 may be one of a glass panel, a plastic film or an encapsulation film.

The first substrate 1110 is a thin film transistor substrate on which thin film transistors are formed. Gate lines, data lines and pixels P are formed on one surface of the first substrate 1110 opposite the second substrate 1120. The pixels P are provided in regions defined by intersection structures between the gate lines and the data lines. The display panel 1100 may be divided into a display area DA having the pixels P formed therein to display an image, and a non-display area NDA configured to display no image. The gate lines, the data lines and the pixels P may be formed in the display area DA. The gate driver 1200, pads and link lines configured to connect the data lines to the pads may be formed in the non-display area NDA.

The pixel P may include at least one transistor serving as a switching element which is turned on by a gate signal of the corresponding gate line to receive data voltage of the data line, and the transistor may be a thin film transistor.

Figure 3:
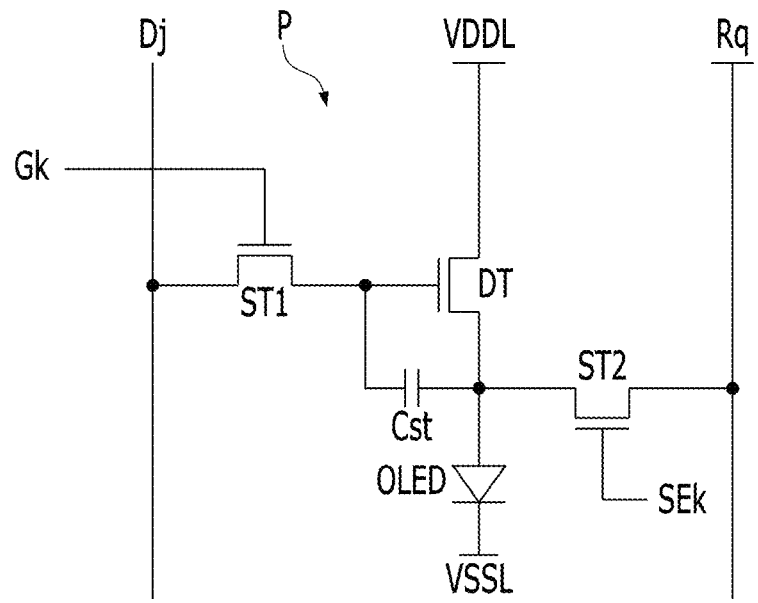
FIG. 3 is a circuit diagram illustrating a pixel of FIG. 2.

For example, each pixel P may include an organic light emitting diode OLED, a driving transistor DT, a plurality of switching transistors and a capacitor Cst, as shown in FIG. 3. The switching transistors may include first and second switching transistors ST1 and ST2. FIG. 3 illustrates only the pixel P connected to a jth data line Dj (j being an integer of 2 or more), a qth reference voltage line Rq (q being an integer of 2 or more), a kth gate line Gk (k being an integer of 2 or more) and a kth initialization line SEk, for convenience of description.

The organic light emitting diode OLED emits light by current supplied through the driving transistor DT. An anode of the organic light emitting diode OLED may be connected to a source electrode of the driving transistor DT, and a cathode of the organic light emitting diode OLED may be connected to a first power voltage line VSSL to which first power voltage is supplied. The first power voltage line VSSL may be a low voltage line to which low power voltage is supplied.

The organic light emitting diode OLED may include the anode, a hole transporting layer, an organic light emitting layer, an electron transporting layer, and the cathode. When voltage is applied to the anode and the cathode, holes and electrons are respectively moved to the organic light emitting layer through the hole transporting layer and the electron transporting layer and are then combined with each other in the organic light emitting layer, and thereby, the organic light emitting diode OLED emits light.

The driving transistor DT is arranged between a second power voltage line VDDL, to which second power voltage is supplied, and the organic light emitting diode OLED. The driving transistor DT adjusts current which flows from the second power voltage line VDDL to the organic light emitting diode OLED according to a voltage difference between a gate electrode and a source electrode of the driving transistor DT. The gate electrode of the driving transistor DT may be connected to a first electrode of the first switching transistor ST1, the source electrode of the driving transistor DT may be connected to the second power voltage line VDDL, and a drain electrode of the driving transistor DT may be connected to the anode of the organic light emitting diode OLED. The second power voltage line VDDL may be a high voltage line to which high power voltage is supplied.

The first switching transistor ST1 is turned on by a kth gate signal of the kth gate line Gk, and supplies voltage of the jth data line Dj to the gate electrode of the driving transistor DT. A gate electrode of the first switching transistor ST1 may be connected to the kth gate line Gk, a source electrode of the first switching transistor ST1 may be connected to the gate electrode of the driving transistor DT, and a drain electrode of the first switching transistor DT may be connected to the jth data line Dj.

The second switching transistor ST2 is turned on by a kth initialization signal of the kth initialization line SEk, and connects the qth reference voltage line Rq to the drain electrode of the driving transistor DT. A gate electrode of the second switching transistor ST2 may be connected to the kth initialization line SEk, a first electrode of the second switching transistor ST2 may be connected to the qth reference voltage line Rq, and a second electrode of the second switching transistor ST2 may be connected to the drain electrode of the driving transistor DT.

The capacitor Cst is formed between the gate electrode and the source electrode of the driving transistor DT. The capacitor Cst stores a differential voltage between the gate voltage and the source voltage of the driving transistor DT.

One electrode of the capacitor Cst may be connected to the gate electrode of the driving transistor DT and the source electrode of the first switching transistor ST1, and the other electrode of the capacitor Cst may be connected to the source electrode of the driving transistor DT, the drain electrode of the second switching transistor ST2 and the anode of the organic light emitting diode OLED.

In FIG. 3, the driving transistor DT, the first switching transistor ST1 and the second switching transistor ST2 of each pixel P may be formed as thin film transistors. Further, although FIG. 3 describes that the driving transistor DT, the first switching transistor ST1 and the second switching transistor ST2 of each pixel P are formed as N-type semiconductor transistors having N-type semiconductor characteristics, the embodiments of the present invention are not limited thereto. That is, the driving transistor DT, the first switching transistor ST1 and the second switching transistor ST2 of each pixel P may be formed as P-type semiconductor transistors having P-type semiconductor characteristics.

The gate driver 1200 outputs gate signals to the gate lines in response to a gate control signal input from the timing controller 1600. The gate driver 1200 may be formed in the non-display area NDA outside one side or both sides of the display area DA of the display panel 1100 using a gate driver in panel (GIP) method. In this case, the gate driver 1200 may include a plurality of transistors to output the gate signals to the gate lines in response to the gate control signal, and the transistors may be thin film transistors respectively.

Figure 4:
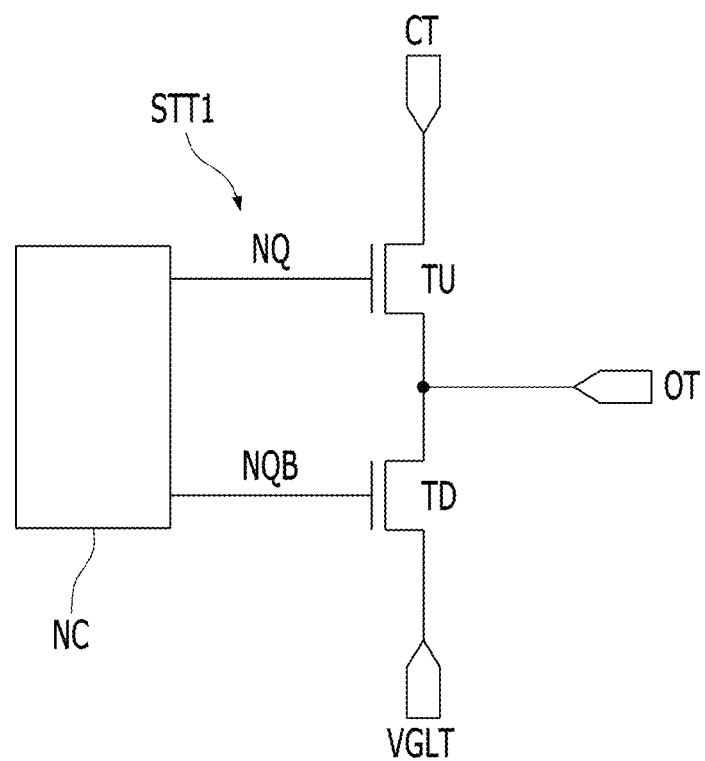
FIG. 4 is a circuit diagram illustrating a portion to the gate driver of FIG. 2.

For example, the gate driver 1200 may include stages STT1 which are dependently connected, as shown in FIG. 4, and the stages STT1 may sequentially output the gate signals to the gate lines.

Each of the stages STT1, as shown in FIG. 4, includes a pull-up node NQ, a pull-down node NQB, a pull-up transistor TU which is turned on when the pull-up node NQ is charged with gate high voltage, a pull-down transistor TD which is turned on when the pull-down node NQB is charged with the gate high voltage, and a node controller NC configured to control charging and discharging of the pull-up node NQ and the pull-down node NQB.

The node controller NC may be connected to a start signal line to which a start signal or a carry signal of a previous stage is input, and a clock line to which one of gate clock signals is input. The node controller NC controls charging and discharging of the pull-up node NQ and the pull-down node NQB in response to the start signal or the carry signal of the previous stage input to the start signal line and the gate clock signal input to the clock line. The node controller NC discharges the pull-down node NQB into gate low voltage when the pull-up node NQ is charged with the gate high voltage, and discharges the pull-up node NQ into the gate low voltage when the pull-down node NQB is charged with the gate high voltage, in order to stably control output of the stage STT1. For this purpose, the node controller NC may include a plurality of transistors.

When the stage STT1 is pulled up, i.e., the pull-up node NQ is charged with the gate high voltage, the pull-up transistor TU is turned on and outputs the gate clock signal of the clock line CL to an output terminal OT. When the stage STT1 is pulled down, i.e., the pull-down node NQB is charged with the gate high voltage, the pull-down transistor TD is turned on and discharges the output terminal OT into gate low voltage of a gate low voltage terminal VGLT.

In FIG. 4, the pull-up transistor TU, the pull-down transistor TD and the transistors of the node controllers NC of each of the stages STT1 of the gate driver 1200 may be formed as thin film transistors. Further, although FIG. 4 describes that the pull-up transistor TU, the pull-down transistor TD and the transistors of the node controllers NC of each of the stages STT1 of the gate driver 1200 are formed as N-type semiconductor transistors having N-type semiconductor characteristics, the embodiments of the present invention are not limited thereto. That is, the pull-up transistor TU, the pull-down transistor TD and the transistors of the node controllers NC of each of the stages STT1 of the gate driver 1200 may be formed as P-type semiconductor transistors having P-type semiconductor characteristics.

The gate driver 1200 may be formed as a driving chip, such as an integrated circuit, and in this case, the gate driver 1200 may be mounted on a gate flexible film using a chip on film (COF) method, and the gate flexible film may be adhered to the first substrate 1110 of the display panel 1100.

The data driver may include at least one source drive integrated circuit (hereinafter referred to as "IC") 1300. The source driver IC 1300 receives digital video data and a source control signal from the timing controller 1600. The source driver IC 1300 converts the digital video data into analog data voltage in response to a source control signal and supplies the analog data voltage to the data lines.

If the source driver IC 1300 is formed as a driving chip, such as an integrated circuit, the source driver IC 1300 may be mounted on the flexible film 1400 using the COF method, as shown in FIGS. 1 and 2. Wirings which connect the pads to the source driver IC 1300 and wirings which connect the pads to wirings of the circuit board 1500 are formed on the flexible film 1400. The flexible film 1400 may be adhered to the pads, such as data pads, formed in the non-display area NDA of the display panel 1100 using an anisotropic conductive film, and thereby, the pads may be connected to the wirings of the flexible film 1400. Alternatively, the source driver IC 1300 may be directly adhered to the pads of the first substrate 1110 of the display panel 1100 using a chip on glass (COG) method or a chip on plastic (COP) method.

The circuit board 1500 may be adhered to the flexible films 1400. A plurality of circuits implemented as driving chips may be mounted on the circuit board 1500. For example, the timing controller 1600 may be mounted on the circuit board 1500. The circuit board 1500 may be a printed circuit board or a flexible printed circuit board.

The timing controller 1600 receives digital video data and a timing signal from an external system board through a cable of the circuit board 1500. The timing controller 1600 generates a gate control signal to control operation timing of the gate driver 1200 and a source control signal to control the source driver ICs 1300 based on the timing signal. The timing controller 1600 supplies the gate control signal to the gate driver 1200, and supplies the source control signal to the source driver IC 1300.

As described above, the display device according to one embodiment of the present invention includes at least one thin film transistor as a switching element in each of the pixels P, and the gate driver 1200 includes a plurality of transistors to sequentially output gate signals to the gate lines when the gate driver 1200 is formed using the GIP method. Therefore, in order to allow the gate driver 1200 to output stable gate signals in the display device requiring high-speed driving due to the ultra-high definition thereof, electron mobility of the transistors of the gate driver 1200 may be increased.

Hereinafter, according to one embodiment of the present invention, a thin film transistor having an oxide semiconductor layer, which may be applied to the transistors of the pixels P and the transistors of the gate driver 1200 of a display device requiring high-speed driving due to the ultra-high definition thereof, will be described in detail.

Figure 5:
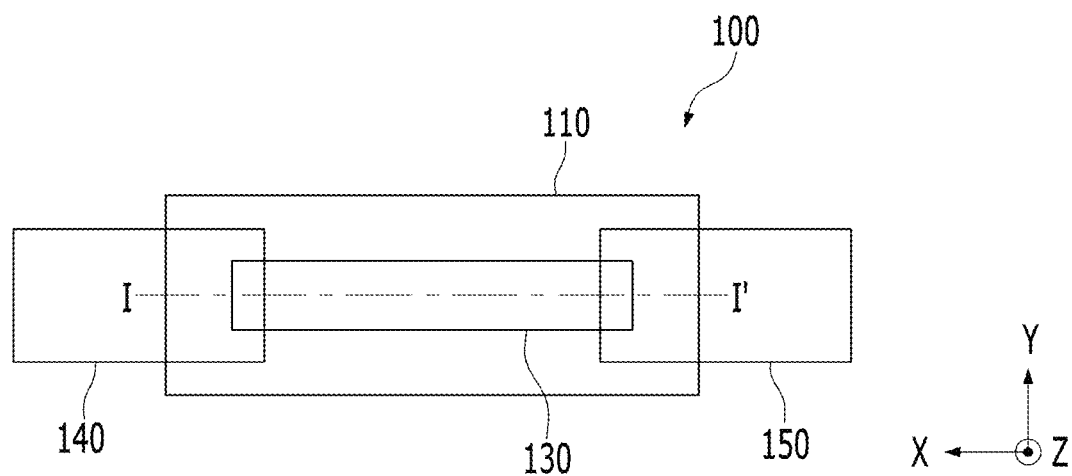
FIG. 5 is a plan view illustrating a thin film transistor according to one embodiment of the present invention.
Figure 6:
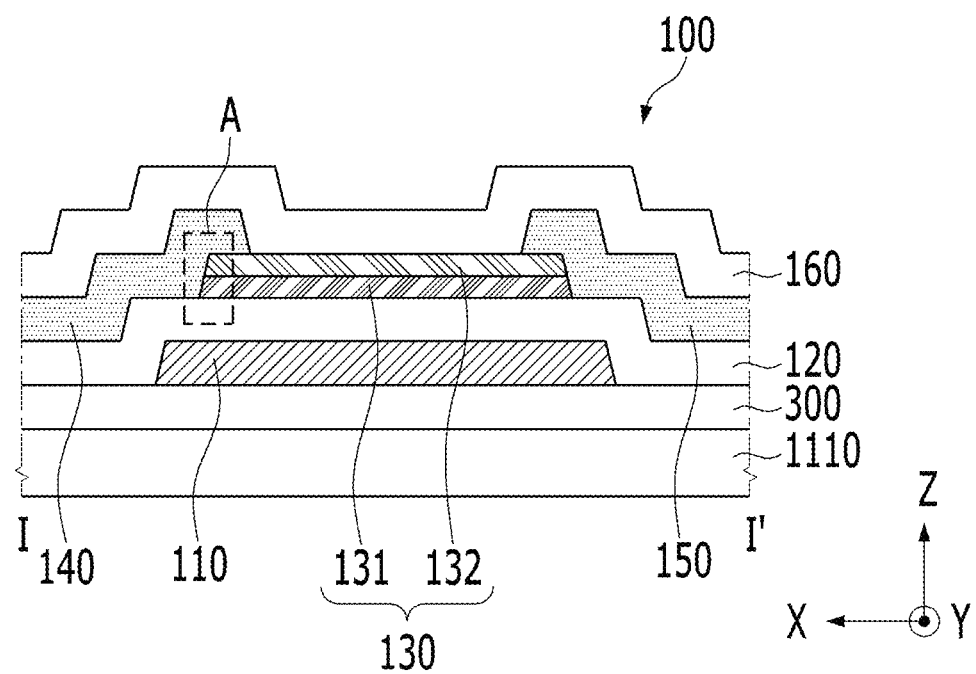
FIG. 6 is a cross-sectional view taken along line I-I' of FIG. 5.

FIG. 5 is a plan view illustrating a thin film transistor according to one embodiment of the present invention, and FIG. 6 is a cross-sectional view taken along line I-I' of FIG. 5.

FIGS. 5 and 6 illustrate that the thin film transistor according to one embodiment of the present invention is formed to have an inverted staggered structure using a back channel etching (BCE) process. The inverted staggered structure may include a bottom gate structure in which a gate electrode is formed under an active layer.

Referring to FIGS. 5 and 6, the thin film transistor 100 according to one embodiment of the present invention may include a gate electrode 110, an oxide semiconductor layer 130, a source electrode 140 and a drain electrode 150.

The thin film transistor 100 is formed on the first substrate 1110. The first substrate 1110 may be formed of plastic or glass.

A buffer film 300 may be formed on the first substrate 1100 in order to protect the thin film transistor 100 from moisture penetrating through the first substrate 1110. The buffer film 300 may include a plurality of inorganic films which are alternately stacked. For example, the buffer film 300 may be a multilayer film formed by alternately stacking one or more inorganic films selected from among a silicon oxide ($SiO_x$) film, a silicon nitride ($SiN_x$) film and a silicon oxynitride (SiON) film. The buffer film 300 may be omitted.

The gate electrode 110 is formed on the buffer film 300. The gate electrode 110 is formed to have a greater area than the oxide semiconductor layer 130 so as to block light incident upon the oxide semiconductor layer 130 from the first substrate 1110, and the oxide semiconductor layer 130 may be shielded thereby. Therefore, the oxide semiconductor layer 130 may be protected from light incident from the first substrate 1110. The gate electrode 110 may be formed in a monolayer or multilayer structure formed of at least one of molybdenum (Mo), aluminum (Al), chromium (Cr), gold (Au), titanium (Ti), nickel (Ni), neodymium (Nd), copper (Cu) or alloys thereof.

A gate insulating film 120 is formed on the gate electrode 110. The gate insulating film 120 may be formed as an inorganic film, for example, a silicon oxide ($SiO_x$) film, a silicon nitride ($SiN_x$) film, a silicon oxynitride (SiON) film, an aluminum oxide ($Al_2O_3$) film or a multilayer film thereof.

The oxide semiconductor layer 130 is formed on the gate insulating film 120. The oxide semiconductor layer 130 is arranged to overlap the gate electrode 110 with the gate insulating film 120 interposed therebetween.

The oxide semiconductor layer 130 includes a first oxide semiconductor layer 131 and a second oxide semiconductor layer 132. The first oxide semiconductor layer 131 is a main channel layer in which electrons move, and is thus arranged close to the gate electrode 110. Therefore, the first oxide semiconductor layer 131 may be defined as a layer which is arranged closer to the gate electrode 110 than the second oxide semiconductor layer 132, and the second oxide semiconductor layer 132 may be defined as a layer which is arranged farther away from the gate electrode 110 than the first oxide semiconductor layer 131. For example, if the thin film transistor 100 is formed in the inverted staggered structure, as shown in FIGS. 5 and 6, the gate electrode 110 is arranged under the oxide semiconductor layer 130, and thus, the first oxide semiconductor layer 131 may be arranged on the gate insulating film 120 and the second oxide semiconductor layer 132 may be arranged on the first oxide semiconductor layer 131.

The source electrode 140 may directly contact one side of the first oxide semiconductor layer 131, which is the main channel layer, and one side of the second oxide semiconductor layer 132. In more detail, the source electrode 140 may directly contact one side surface of the first oxide semiconductor layer 131 and one side surface and a portion of the upper surface of the second oxide semiconductor layer 132. Further, the drain electrode 150 may directly contact the other side of the first oxide semiconductor layer 131 and the other side of the second oxide semiconductor layer 132. In more detail, the drain electrode 150 may directly contact the other side surface of the first oxide semiconductor layer 131 and the other side surface and a portion of the upper surface of the second oxide semiconductor layer 132. The source electrode 140 and the drain electrode 150 may be formed in a monolayer or multilayer structure formed of at least one of molybdenum (Mo), aluminum (Al), chromium (Cr), gold (Au), titanium (Ti), nickel (Ni), neodymium (Nd), copper (Cu) or alloys thereof.

A protective film 160 is formed on the oxide semiconductor layer 130, the source electrode 140 and the drain electrode 150. The protective film 160 is formed as an inorganic film, for example, a silicon oxide ($SiO_x$) film, a silicon nitride ($SiN_x$) film, a silicon oxynitride (SiON) film, an aluminum oxide ($Al_2O_3$) film or a multilayer film thereof.

The first oxide semiconductor layer 131 may be formed of iron-indium-zinc oxide (FIZO) including iron (Fe), indium (In) and zinc (Zn), in order to increase electron mobility.

Figure 7:
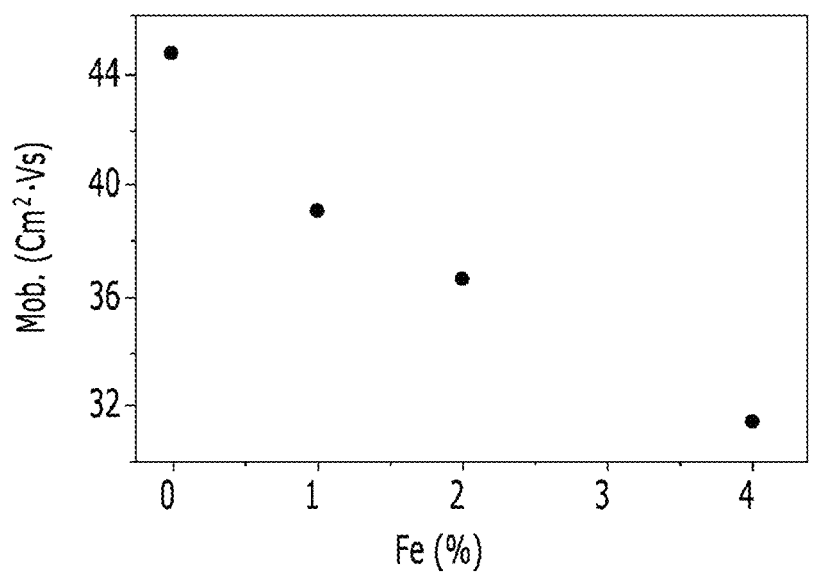
FIG. 7 is a graph showing electron mobility depending on the content of iron (Fe) in a first oxide semiconductor layer.

As shown in FIG. 7, in order to increase electron mobility to about 32 $cm^2/V·s$ or higher, the content of iron (Fe) in the first oxide semiconductor layer 131 may be within the range of 0.2% to 4% of the sum of the mole percents of the respective elements in the first oxide semiconductor layer 131, and the content of indium (In) in the first oxide semiconductor layer 131 may be higher than the content of zinc (Zn) in the first oxide semiconductor layer 131. The contents of the respective elements may be defined in a mole percent.

If the first oxide semiconductor layer 131 is formed of iron-indium-gallium-zinc oxide (FIGZO) additionally including gallium (Ga), there may be a limit in realizing high electron mobility. Gallium may suppress generation of carriers caused by oxygen vacancies through chemical bonding with oxygen of the oxide semiconductor, thus being capable of reducing off current when driving the thin film transistor and contributing to formation of a structurally stable thin film. However, due to the above properties of gallium suppressing generation of carriers of the oxide semiconductor, there may be a limit in realizing high electron mobility.

A structure of the first oxide semiconductor layer 131 including an indium-zinc oxide (IZO) semiconductor including indium (In) and zinc (Zn) without gallium (Ga) may have more oxygen vacancies than a structure of the first oxide semiconductor layer 131 including an indium-gallium-zinc oxide (IGZO) semiconductor including indium (In), gallium (Ga) and zinc (Zn).

For this reason, degradation of a thin film transistor including the indium-zinc oxide (IZO) semiconductor including indium (In) and zinc (Zn) may become severe due to negative bias temperature illumination stress (NBTIS). That is, such a thin film transistor may have poor light reliability expressed as NBTIS.

Therefore, in order to realize an oxide semiconductor having both high stability and high electron mobility, the first oxide semiconductor layer 131 is formed of iron-indium-zinc oxide (FIZO) including iron (Fe) instead of gallium (Ga), indium (In) and zinc (Zn).

Figure 8:
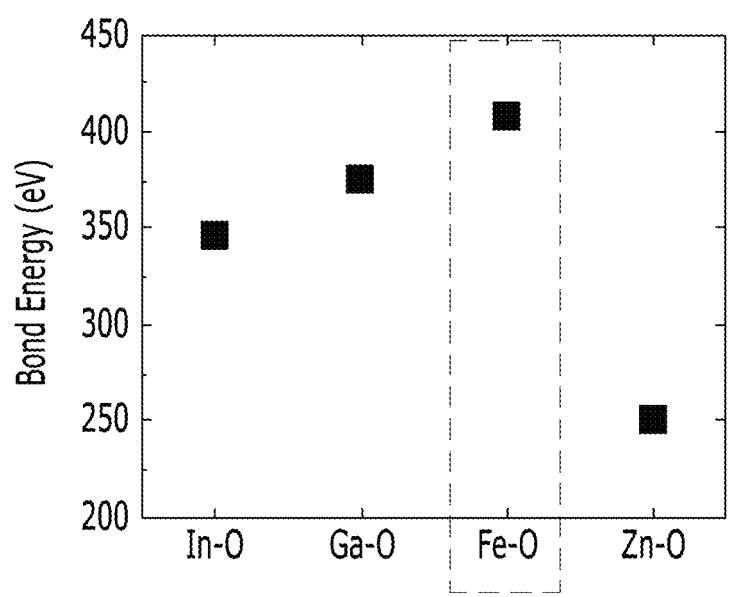
FIG. 8 is a graph showing bonding force of iron (Fe), indium (In), gallium (Ga) and zinc (Zn) with oxygen.

As shown in FIG. 8, iron (Fe) has strong bonding force with oxygen compared to indium (In), gallium (Ga) and zinc (Zn), and thus, even when a small amount of iron (Fe) is added to the first oxide semiconductor layer 131, iron (Fe) may serve to be strongly combined with oxygen. Therefore, the first oxide semiconductor layer 131 formed of iron-indium-zinc oxide (FIZO) including iron (Fe), indium (In) and zinc (Zn) may high chemical resistance and adjust a proper number of oxygen vacancies compared to the first oxide semiconductor layer 131 formed of indium-zinc oxide (IZO) including indium (In) and zinc (Zn).

The content ratio of iron (Fe) to indium (In) (Fe/In) in the first oxide semiconductor layer 131 may be smaller than the content ratio of zinc (Zn) to indium (In) (Zn/In) in the first oxide semiconductor layer 131.

The content of indium (In) in the first oxide semiconductor layer 131 may be greater than the content of zinc (Zn) in the first oxide semiconductor layer 131.

The content of zinc (Zn) in the first oxide semiconductor layer 131 may be greater than the content of iron (Fe) in the first oxide semiconductor layer 131 and be smaller than the content of indium (In) in the first oxide semiconductor layer 131.

The oxide semiconductor layer 130 may further include the second oxide semiconductor layer 132 so as to to implement a short channel while maintaining a threshold voltage value and NBTIS characteristics to improve reliability of the thin film transistor 100

That is, in order to prevent a shift in threshold voltage if the oxide semiconductor layer 130 is formed as a short channel, the oxide semiconductor layer 130 may further include the second oxide semiconductor layer 132 formed of indium-gallium-zinc oxide (IGZO) including indium (In), gallium (Ga) and zinc (Zn), or an oxide including at least one of indium (In), gallium (Ga) or zinc (Zn).

Figure 9:
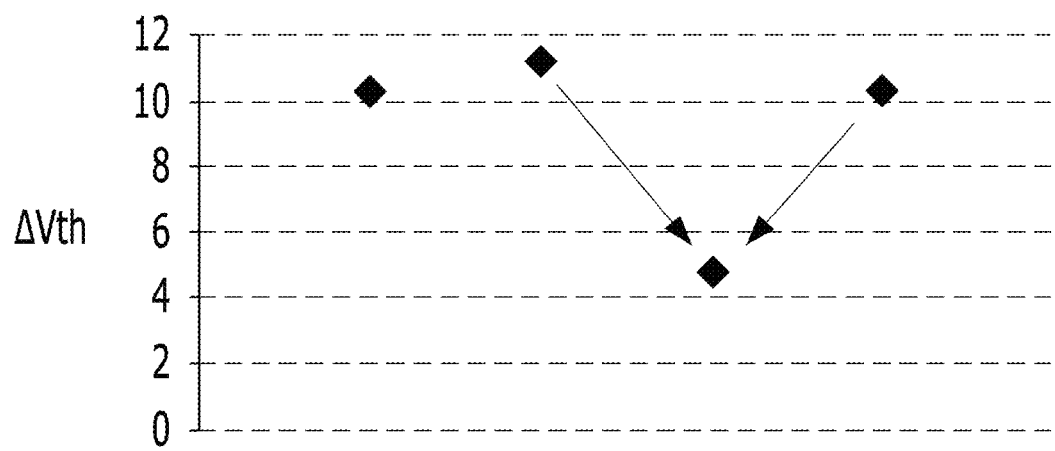
FIG. 9 is a graph showing NBTIS characteristics depending on composition ratios and thicknesses of the first oxide semiconductor layer and a second oxide semiconductor layer.

In FIG. 9, a test of a structure in which the oxide semiconductor layer 130 includes the first oxide semiconductor layer 131 formed of iron-indium-zinc oxide (FIZO) including iron (Fe), indium (In) and zinc (Zn) and the second oxide semiconductor layer 132 formed of indium-gallium-zinc oxide (IGZO) including indium (In), gallium (Ga) and zinc (Zn) was carried out.

Though the test, the NBTIS characteristics may be improved, and a threshold voltage variation value ΔVth satisfying the specifications of products may, in general, be within 5V.

The test was carried out under conditions in which the composition ratio of iron:indium:zinc in the first oxide semiconductor layer 131 and the thickness of the first oxide semiconductor layer 131 are set to 0.3:7:2.7 and 100 Å and the composition ratio of indium:gallium:zinc in the second oxide semiconductor layer 132 and the thickness of the second oxide semiconductor layer 132 are set to 5:1:4 and 300 Å, 1:1:1 and 300 Å, and 1:3:6 and 300 Å.

Figure 10:
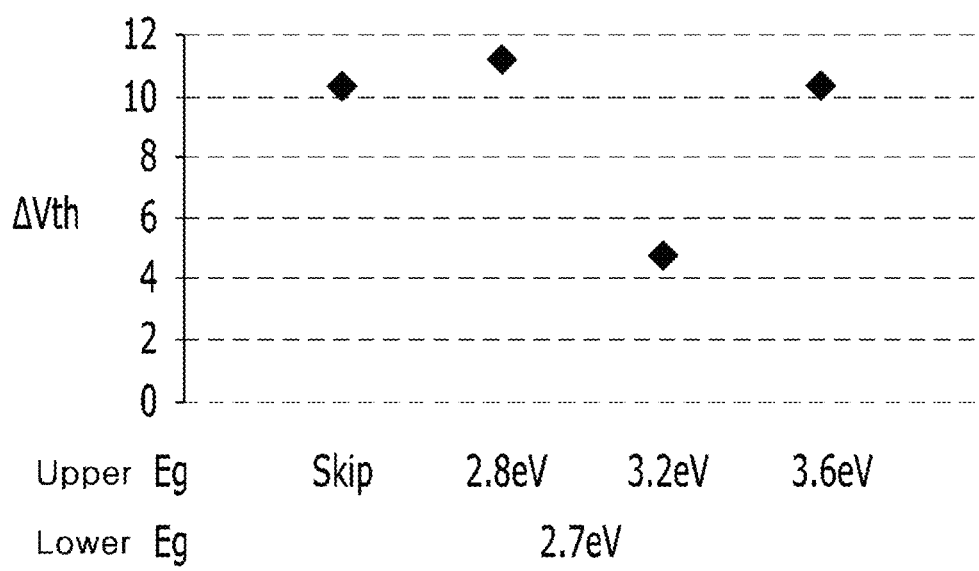
FIG. 10 is a graph showing band-gap energies of the first oxide semiconductor layer and the second oxide semiconductor layer of FIG. 9.

FIG. 10 is a graph showing band-gap energies of the second oxide semiconductor layers 132, measured depending on the composition ratios of indium:gallium:zinc.

Figure 11:
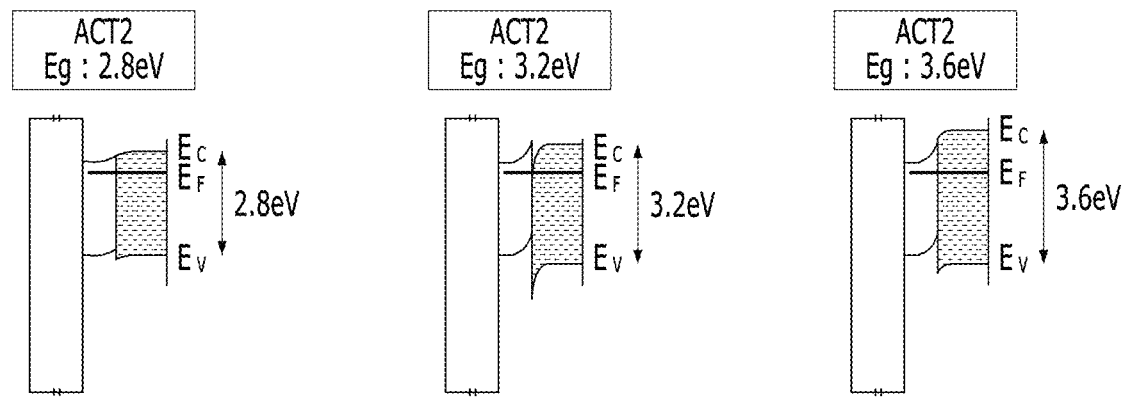
FIG. 11 illustrates band diagrams of the oxide semiconductor layers of FIG. 9.

FIG. 11 illustrates band diagrams between the first oxide semiconductor layer 131 and the second oxide semiconductor layers 132 tested in FIG. 9. Particularly, as shown in FIG. 11, when the composition ratio of indium:gallium:zinc in the second oxide semiconductor layer 132 and the thickness of the second oxide semiconductor layer 132 are set to 1:1:1 and 300 Å, the band-gap energy of the oxide semiconductor layer 130 is measured as 3.2 eV, and the oxide semiconductor layer 130 may have a hetero-junction structure.

Here, a depletion region formed by a built-in potential due to a Fermi level difference between thin films is formed at a junction between the first oxide semiconductor layer 131 and the second oxide semiconductor layer 132, and the built-in potential causes band bending at the junction. The oxide semiconductor layer 130 has the depletion region, and may thus control total charge density, thereby being capable of preventing the threshold voltage from shifting depending on the length of the channel.

That is, in one embodiment of the present invention, the charge density in the oxide semiconductor layer 130 formed as a thin film having high electron mobility may be effectively controlled by forming the second oxide semiconductor layer 132, and thus, a shift in the threshold voltage depending on a change in the length of the channel of the oxide semiconductor layer 130 may be prevented. As a result, one embodiment of the present invention may simultaneously increase electron mobility and ensure desirable characteristics of the thin film transistor.

In addition, if the channel of the oxide semiconductor layer 130 has a width of 4 μm and a length of 4 μm, as shown in FIG. 7, electron mobility may be about 40 $cm^2/V \cdot s$. The electron mobility of the above thin film transistor is considerably high compared to a thin film transistor including a general IGZO-based oxide semiconductor layer which has electron mobility of about 10 $cm^2/V \cdot s$ at the same channel width and length. Although the thin film transistor according to one embodiment of the present invention is implemented as a short channel, threshold voltage is not changed, and electron mobility may be remarkably improved.

Further, the second oxide semiconductor layer 132 may be configured according to the following conditions so as to cap and protect the first oxide semiconductor layer 131 so that the first oxide semiconductor layer 131 may stably function as a channel.

The second oxide semiconductor layer 132 may have lower conductivity and a wider band gap than the first oxide semiconductor layer 131.

The content ratio of zinc (Zn) to indium (In) (Zn/In) in the second oxide semiconductor layer 132 of the thin film transistor 100 may be greater than the content ratio of zinc (Zn) to indium (In) (Zn/In) in the first oxide semiconductor layer 131.

The resistance and band-gap energy of the second oxide semiconductor layer 132 of the thin film transistor 100 may be greater than those of the first oxide semiconductor layer 131.

The band-gap energy of the second oxide semiconductor layer 132 may be within the range of 105% to 130% of the band-gap energy of the first oxide semiconductor layer 131.

As described above, the second oxide semiconductor layer 132 is formed of indium-gallium-zinc oxide (IGZO) including indium (In), gallium (Ga) and zinc (Zn), and may thus prevent threshold voltage from varying even if the oxide semiconductor layer 130 is formed as a short channel, and perform a function of capping and protecting the first oxide semiconductor layer 131 so that the first oxide semiconductor layer 131 may stably function as a channel.

Figure 12:
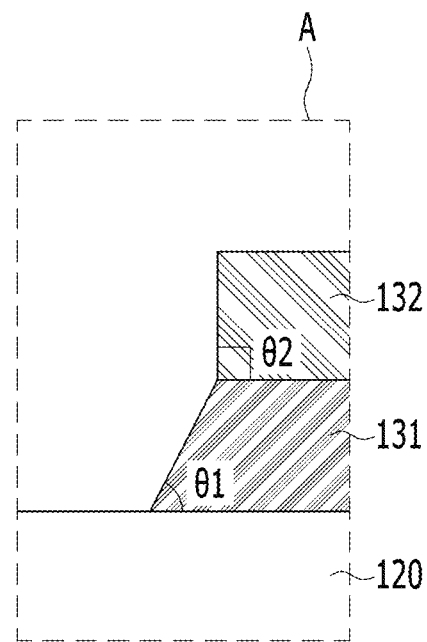
FIGS. 12 and 13 are enlarged cross-sectional views illustrating embodiments of region A of FIG. 6.
Figure 13:
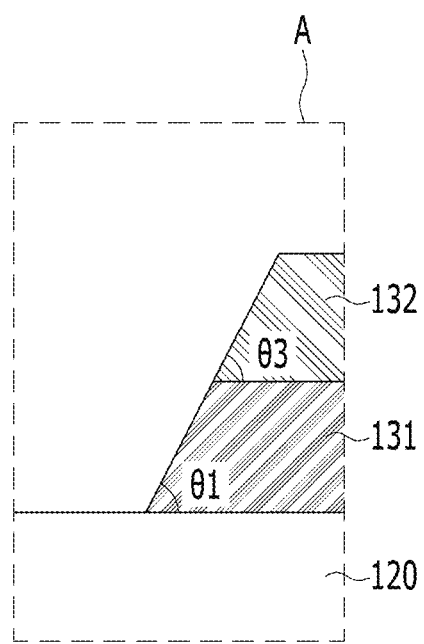

FIGS. 12 and 13 are enlarged cross-sectional views illustrating embodiments of region A of FIG. 6.

Referring to FIGS. 12 and 13, the inclination of each of the side surfaces of the first oxide semiconductor layer 131 may be formed at a first angle θ1 which is an acute angle.

The inclination of each of the side surfaces of the second oxide semiconductor layer 132 may be formed at a second angle θ2 which is a right angle, as shown in FIG. 12, or be formed at a third angle θ3 which is an acute angle, as shown in FIG. 13.

In more detail, the oxide semiconductor layer 130 may include the first oxide semiconductor layer 131 formed of iron-indium-zinc oxide (FIZO) including iron (Fe), indium (In) and zinc (Zn) and the second oxide semiconductor layer 132 formed of an oxide including at least one of indium (In), gallium (Ga) or zinc (Zn), or indium-gallium-zinc oxide (IGZO) including indium (In), gallium (Ga) and zinc (Zn).

Property analysis images shown in FIG. 14 show transmission electron microscopy (TEM) fast Fourier transform (FFT) patterns of first oxide semiconductor layers 131.

As shown in FIG. 14, indium-zinc oxide (IZO) including indium (In) and zinc (Zn) basically has crystalline properties at room temperature, but iron-indium-zinc oxide (FIZO) may exhibit amorphous properties due to addition of iron (Fe). In this case, when deposition is carried out at a high temperature, iron-indium-zinc oxide (FIZO) may exhibit crystalline properties again. Here, the deposition temperature may be 100° C. or higher, and particularly, be close to 200° C.

When the first oxide semiconductor layer 131 and the second oxide semiconductor layer 132 are deposited, if the first oxide semiconductor layer 131 is amorphous, the etching rate (Å/sec) of the first oxide semiconductor layer 131 may be higher than the etching rate of the second oxide semiconductor layer 132.

As shown in FIG. 6, if the first oxide layer 131 is arranged under the second oxide layer 132, when the etching rate of the first oxide semiconductor layer 131 is higher than the etching rate of the second oxide semiconductor layer 132, the inclination of each of the side surfaces of the second oxide semiconductor layer 132 may be formed at an obtuse angle.

Property analysis images shown in FIG. 15 show the transmission electron microscopy (TEM) fast Fourier transform (FFT) patterns of the first oxide semiconductor layers 131 and the etching rates of the oxide semiconductor layers 130.

That is, as shown in FIG. 15, when the first oxide semiconductor layer 131 and the second oxide semiconductor layer 132 are deposited, if the first oxide semiconductor layer 131 is amorphous, each of the side surfaces of the second oxide semiconductor layer 132 may be formed in an inverted tapered structure.

In this case, even when the source electrode 140 and the drain electrode 150 are formed to cover the side surfaces of the first oxide semiconductor layer 131 and the side surfaces of the second oxide semiconductor layers 132, pores may be formed at the boundary between the first oxide semiconductor layer 131 and the second oxide semiconductor layer 132. Thereby, an etching solution to etch the source electrode 140 and the drain electrode 150 may penetrate into the pores, and the first oxide semiconductor layer 131 and the second oxide semiconductor layer 132 may be additionally etched due to the etching solution penetrating into the pores.

Consequently, the first oxide semiconductor layer 131 and the second oxide semiconductor layer 132 may have a different channel length or channel width from a desired channel length or channel width.

However, as shown in FIG. 15, when the first oxide semiconductor layer 131 and the second oxide semiconductor layer 132 are deposited, if the first oxide semiconductor layer 131 is crystalline, the etching rate (Å/sec) of the first oxide semiconductor layer 131 may be lower than or substantially the same as the etching rate of the second oxide semiconductor layer 132. The inclination of each of the side surfaces of the second oxide semiconductor layer 132 may be formed at an acute angle or a right angle.

That is, each of the side surfaces of the second oxide semiconductor layer 132 may be formed in a regular tapered structure. In this case, when the source electrode 140 and the drain electrode 150 are formed to cover the side surfaces of the first oxide semiconductor layer 131 and the side surfaces of the second oxide semiconductor layers 132, pores are not formed at the boundary between the first oxide semiconductor layer 131 and the second oxide semiconductor layer 132. Thereby, additional etching of the first oxide semiconductor layer 131 and the second oxide semiconductor layer 132 due to the etching solution penetrating into the pores may be prevented. Therefore, the first oxide semiconductor layer 131 and the second oxide semiconductor layer 132 do not have a different channel length or channel width from a desired channel length or channel width.

The first oxide semiconductor layer 131 may have a thickness of 50 Å to 300 Å in consideration of characteristics of the material thereof having high electron mobility. The first oxide semiconductor layer 131 may have a thickness exceeding the above range, and various thicknesses may be selected in consideration of process time and costs.

The second oxide semiconductor layer 132 may have a thickness of 100 Å in consideration of high reliability. Various thicknesses may be selected in consideration of process time and costs.

Therefore, the thickness of the first oxide semiconductor layer 131 may be set in advance to 50 Å to 300 Å in consideration of a threshold voltage shift and an oxygen or hydrogen concentration of an upper or lower insulting film contacting the first oxide semiconductor layer 131, and in FIG. 15, the test was carried out under the condition that the thickness of the first oxide semiconductor layer 131 was set to 100 Å, as an example.

Figure 16:
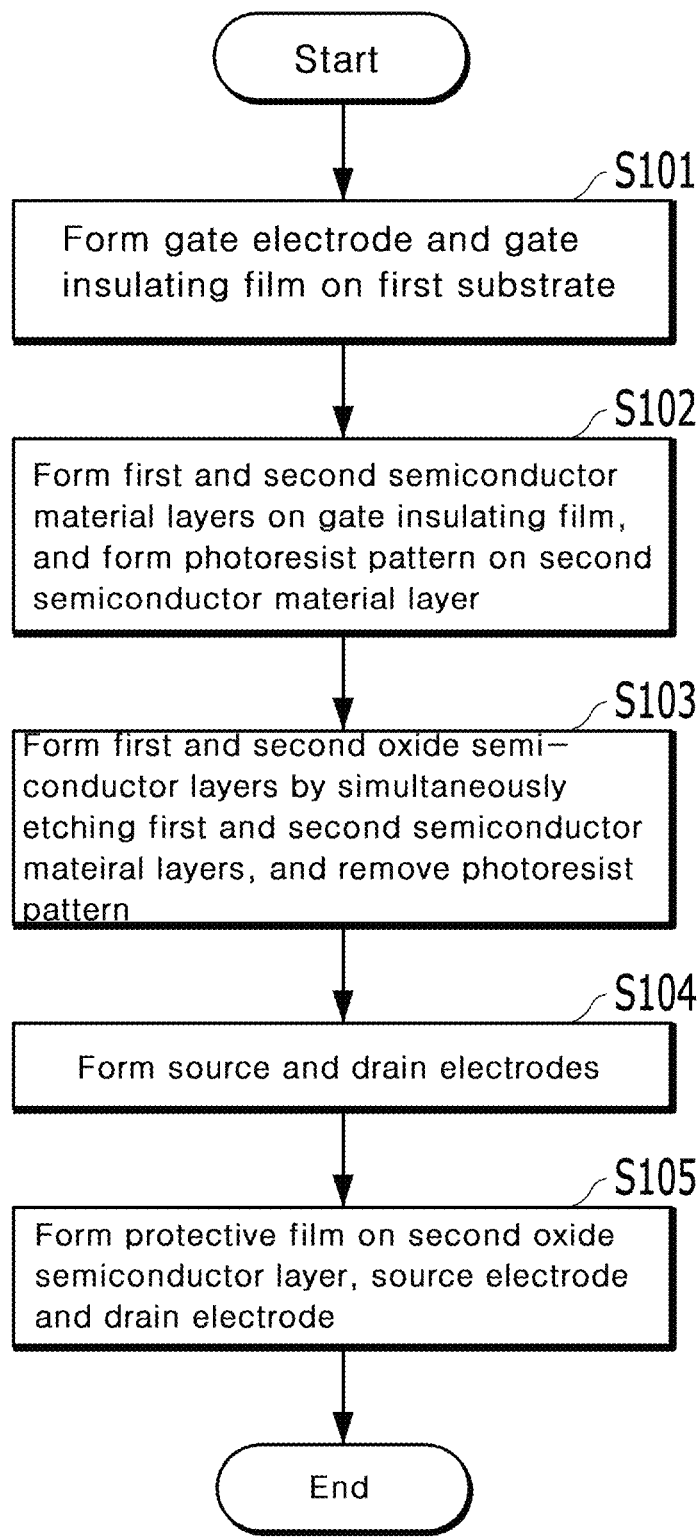
FIG. 16 is a flowchart illustrating a method for manufacturing a thin film transistor according to one embodiment of the present invention.

FIG. 16 is a flowchart illustrating a method for manufacturing a thin film transistor according to one embodiment of the present invention. FIGS. 17A to 17E are cross-sectional views illustrating the method according to one embodiment of the present invention. Hereinafter, the method according to one embodiment of the present invention will be described in detail with reference to FIG. 16 and FIGS. 17A to 17E.

Figure 17A:
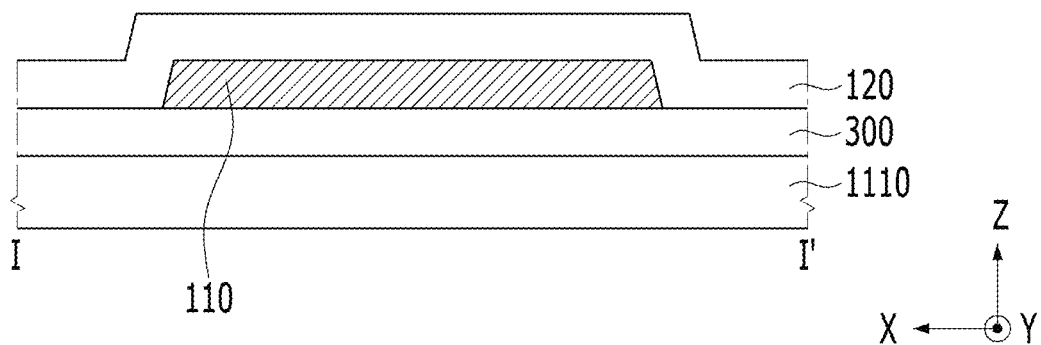
FIGS. 17A to 17E are cross-sectional views illustrating the method according to one embodiment of the present invention.

Firstly, a gate electrode 110 is formed on a substrate 1110, and an insulating film 120 is formed on the gate electrode 110, as shown in FIG. 17A (S101 in FIG. 16).

Concretely, a first metal layer is formed on the first substrate 1110 by sputtering. Thereafter, the gate electrode 110 is formed by forming a photoresist pattern on the first metal layer and patterning the first metal layer using a mask process for etching the first metal layer. The gate electrode 110 may be formed in a monolayer or multilayer structure formed of at least one of molybdenum (Mo), aluminum (Al), chromium (Cr), gold (Au), titanium (Ti), nickel (Ni), neodymium (Nd), copper (Cu) or alloys thereof.

Alternatively, in order to protect a thin film transistor 100 from moisture penetrating through the first substrate 1110, a buffer film 300 may be formed on the first substrate 1100, and the gate electrode 110 may be formed on the buffer film 300. In this case, the buffer film 300 may include a plurality of inorganic films which are alternately stacked. For example, the buffer film 300 may be a multilayer film formed by alternately stacking one or more inorganic films selected from among a silicon oxide ($SiO_x$) film, a silicon nitride ($SiN_x$) film and a silicon oxynitride (SiON) film. The buffer film 300 may be formed using plasma enhanced chemical vapor deposition (PECVD).

Thereafter, the gate insulating film 120 is formed on the gate electrode 110. The gate insulating film 120 may be formed as an inorganic film, for example, a silicon oxide ($SiO_x$) film, a silicon nitride ($SiN_x$) film, a silicon oxynitride (SiON) film, an aluminum oxide ($Al_2O_3$) film or a multilayer film thereof. The gate insulating film 120 may be formed using PECVD.

Figure 17B:
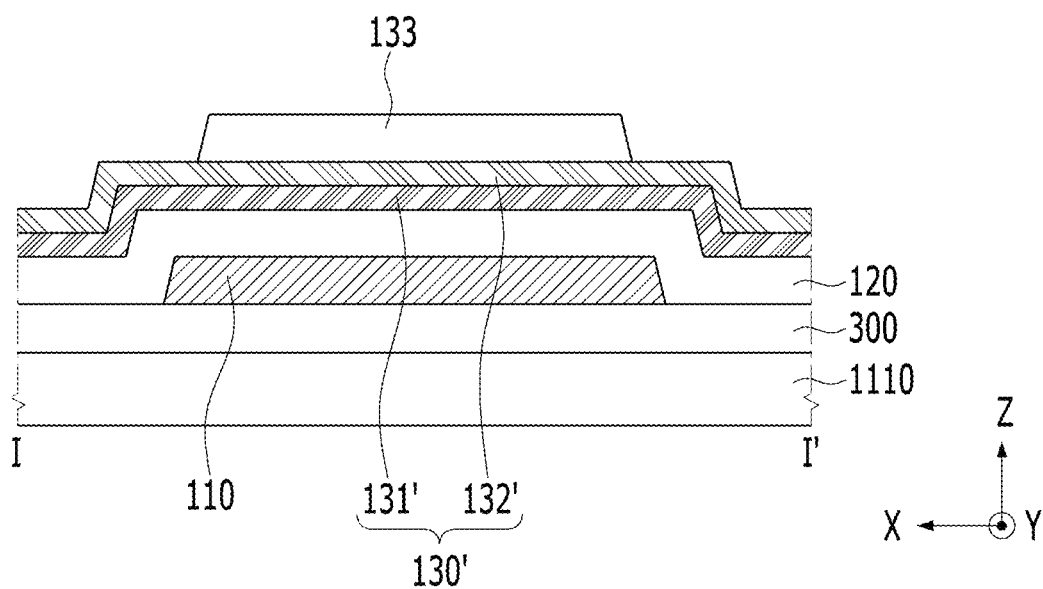

Secondarily, a first semiconductor material layer 131' and a second semiconductor material layer 132' are formed on the gate insulating film 120, and a photoresist pattern 133 is formed on the second semiconductor material layer 132', as shown in FIG. 17B (S102 in FIG. 16).

Concretely, the first semiconductor material layer 131' is formed on the gate insulating film 120. The first semiconductor material layer 131' may be formed of iron-indium-zinc oxide (FIZO) including iron (Fe), indium (In) and zinc (Zn) in order to increase electron mobility.

Thereafter, the second semiconductor material layer 132' is formed on the first semiconductor material layer 131'. The second semiconductor material layer 132' may include indium-gallium-zinc oxide (IGZO) in order to prevent threshold voltage from rapidly shifting according to a change in the length of a channel. The second semiconductor material layer 132' may be formed of an oxide including at least one of indium (In), gallium (Ga) or zinc (Zn). If the second semiconductor material layer 132' is formed of indium-gallium-zinc oxide (IGZO), the second semiconductor material layer 132' has a different composition ratio of indium:gallium:zinc from that of the first semiconductor material layer 131'. The first semiconductor material layer 131' and the second semiconductor material layer 132' may be continuously deposited using the same equipment. Further, the first semiconductor material layer 131' and the second semiconductor material layer 132' may be deposited while the temperature of the substrate 1110 is maintained at 200° C. or higher.

Thereafter, the photoresist pattern 133 is formed on the second semiconductor material layer 132'.

Figure 17C:
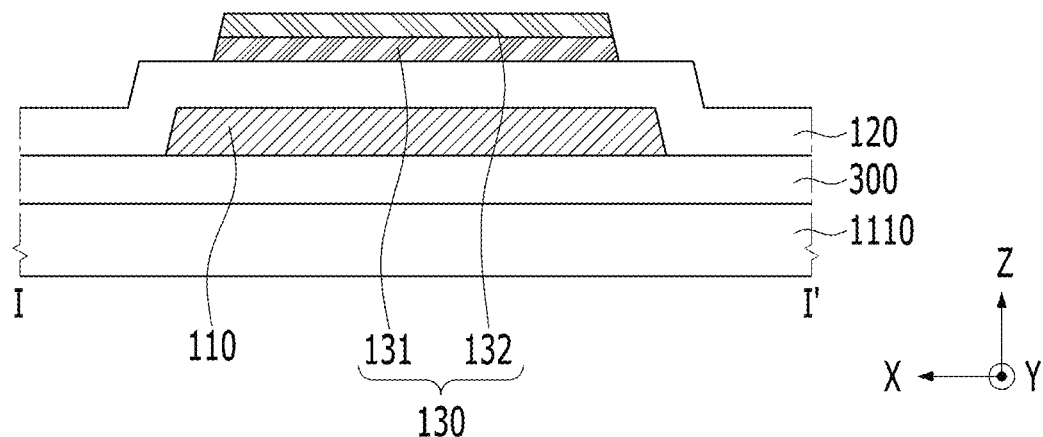

Thirdly, a first oxide semiconductor layer 131 and a second oxide semiconductor layer 132 are formed by simultaneously etching the first semiconductor material layer 131' and the second semiconductor material layer 132', and the photoresist pattern 133 is removed, as shown in FIG. 17C (S103 in FIG. 16).

Concretely, referring again to FIGS. 14 and 15, when the first semiconductor material layer 131' and the second semiconductor material layer 132' are deposited and the temperature of the first substrate 1110 is lower than 100° C., if the first semiconductor material layer 131' and the second semiconductor material layer 132' are etched and the first semiconductor material layer 131' is not crystallized due to the low temperature of the first substrate 1110, the etching rate of the first semiconductor material layer 131' is higher than the etching rate of the second semiconductor material layer 132', and thus, the inclination of the side surfaces of the second oxide semiconductor layer 132 may be formed at an obtuse angle. In this case, even when a source electrode 140 and a drain electrode 150 are formed to cover the side surfaces of the first oxide semiconductor layer 131 and the side surfaces of the second oxide semiconductor layers 132, pores may be formed at the boundary between the first oxide semiconductor layer 131 and the second oxide semiconductor layer 132.

Thereby, an etching solution to etch the source electrode 140 and the drain electrode 150 may penetrate into the pores, and the first oxide semiconductor layer 131 and the second oxide semiconductor layer 132 may be additionally etched due to the etching solution penetrating into the pores. Consequently, the first oxide semiconductor layer 131 and the second oxide semiconductor layer 132 may have a different channel length or channel width from a desired channel length or channel width.

However, when the first semiconductor material layer 131' and the second semiconductor material layer 132' are deposited, if the first semiconductor material layer 131' and the second semiconductor material layer 132' are etched while the temperature of the first substrate 1110 is maintained close to 200° C., the etching rate of the second semiconductor material layer 132' is higher than the etching rate of the first semiconductor material layer 131', and thus, the inclination of the side surfaces of the second oxide semiconductor layer 132 may be formed at an acute angle. In this case, when the source electrode 140 and the drain electrode 150 are formed to cover the side surfaces of the first oxide semiconductor layer 131 and the side surfaces of the second oxide semiconductor layers 132, pores are not formed at the boundary between the first oxide semiconductor layer 131 and the second oxide semiconductor layer 132. Thereby, additional etching of the first oxide semiconductor layer 131 and the second oxide semiconductor layer 132 due to the etching solution penetrating into the pores may be prevented. Therefore, the first oxide semiconductor layer 131 and the second oxide semiconductor layer 132 do not have a different channel length or channel width from a desired channel length or channel width.

The first semiconductor material layer 131 and the second semiconductor material layer 132 may be formed by simultaneously etching the first semiconductor material layer 131' and the second semiconductor material layer 132' using an etching solution which may simultaneously etch the first semiconductor material layer 131' and the second semiconductor material layer 132', such as oxalic acid. Thereafter, the photoresist pattern 133 may be removed through a stripping process.

Figure 17D:
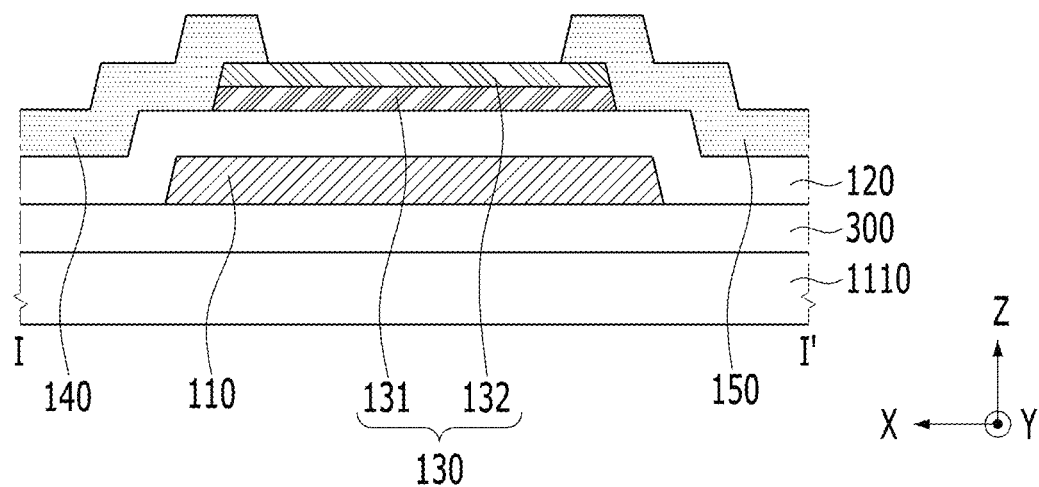

Fourthly, the source electrode 140 and the drain electrode 150 are formed, as shown in FIG. 17D (S104 in FIG. 16).

The source electrode 140 may directly contact one side of the first oxide semiconductor layer 131, which is a main channel layer, and one side of the second oxide semiconductor layer 132. In more detail, the source electrode 140 may directly contact one side surface of the first oxide semiconductor layer 131 and one side surface and a portion of the upper surface of the second oxide semiconductor layer 132. Further, the drain electrode 150 may directly contact the other side of the first oxide semiconductor layer 131 and the other side of the second oxide semiconductor layer 132. In more detail, the drain electrode 150 may directly contact the other side surface of the first oxide semiconductor layer 131 and the other side surface and a portion of the upper surface of the second oxide semiconductor layer 132. The source electrode 140 and the drain electrode 150 may be formed in a monolayer or multilayer structure formed of at least one of molybdenum (Mo), aluminum (Al), chromium (Cr), gold (Au), titanium (Ti), nickel (Ni), neodymium (Nd), copper (Cu) or alloys thereof.

Figure 17E:
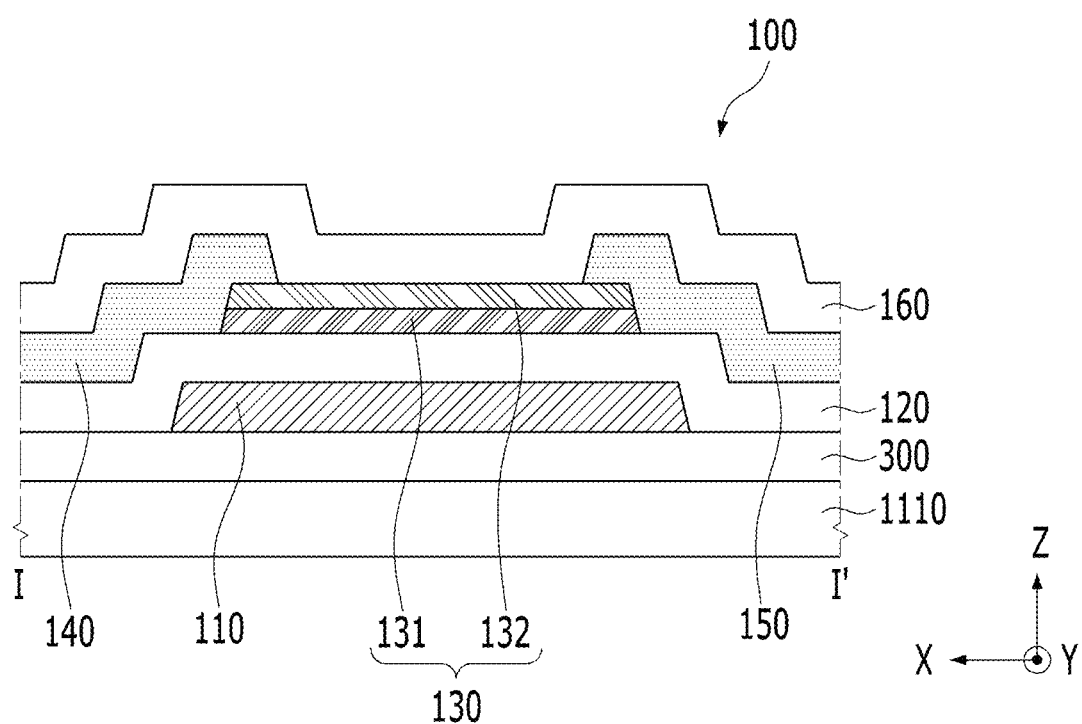

Fifthly, a protective film 160 is formed on an oxide semiconductor layer 130, the source electrode 140 and the drain electrode 150, as shown in FIG. 17E (S105 in FIG. 16).

The protective film 160 may be formed as an inorganic film, for example, a silicon oxide ($SiO_x$) film, a silicon nitride ($SiN_x$) film or a multilayer film thereof.

Figure 18:
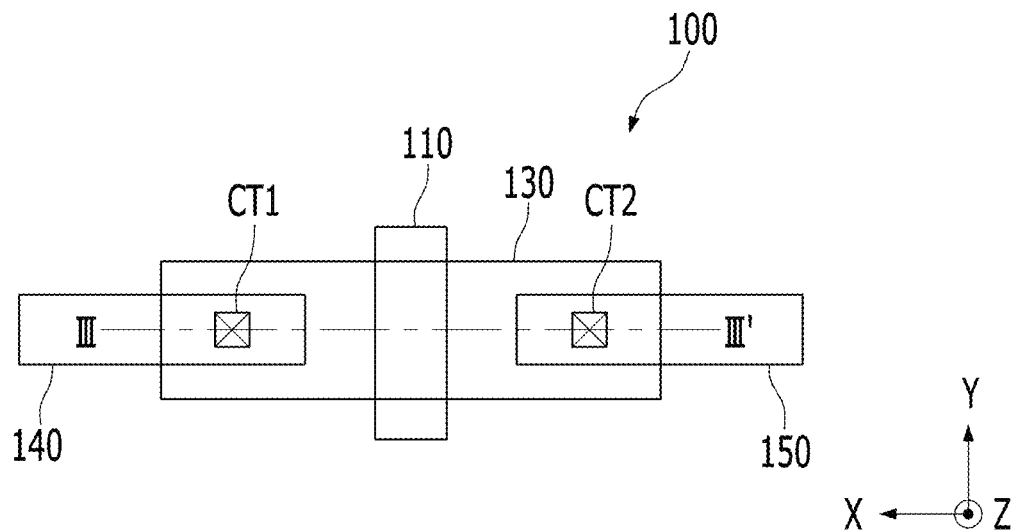
FIG. 18 is a plan view illustrating a thin film transistor according to another embodiment of the present invention.
Figure 19:
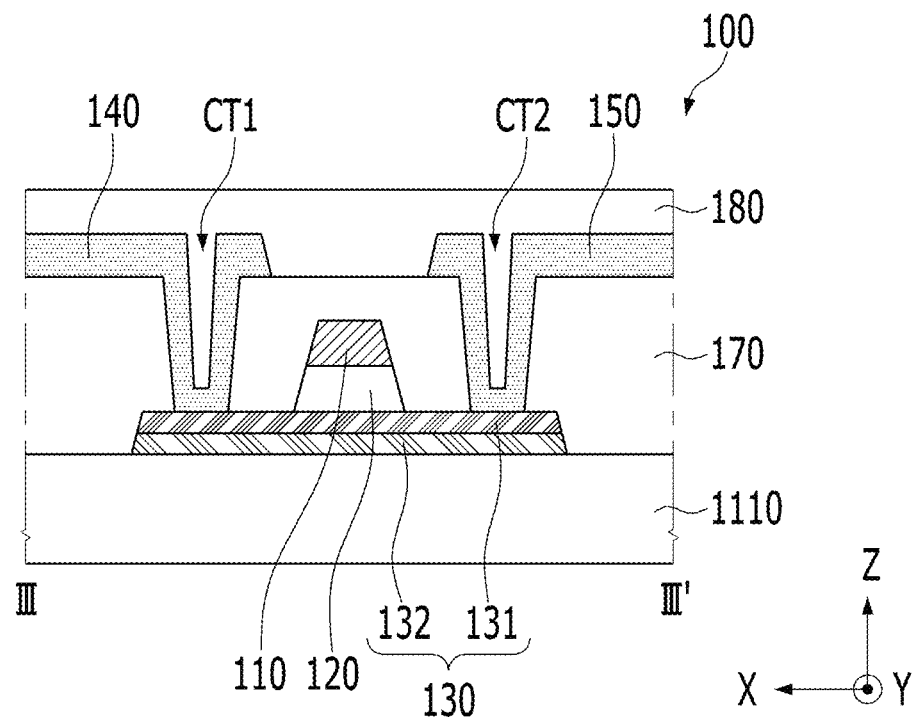
FIG. 19 is a cross-sectional view taken along line III-III' of FIG. 18.

FIG. 18 is a plan view illustrating a thin film transistor according to another embodiment of the present invention. FIG. 19 is a cross-sectional view taken along line III-III' of FIG. 18.

FIGS. 18 and 19 exemplarily illustrate that the thin film transistor according to another embodiment of the present invention is formed in a coplanar structure. The coplanar structure is a top gate structure in which a gate electrode is formed on an active layer.

Referring to FIGS. 18 and 19, a thin film transistor 100 according to another embodiment of the present invention includes a gate electrode 110, an oxide semiconductor layer 130, a source electrode 140 and a drain electrode 150.

The thin film transistor 100 is formed on a first substrate 1110. The first substrate 1110 may be formed of plastic or glass.

A buffer film 300 may be formed on the first substrate 1100 in order to protect the thin film transistor 100 from moisture penetrating through the first substrate 1110. The buffer film 300 may include a plurality of inorganic films which are alternately stacked. For example, the buffer film 300 may be a multilayer film formed by alternately stacking one or more inorganic films selected from among a silicon oxide ($SiO_x$) film, a silicon nitride ($SiN_x$) film and a silicon oxynitride (SiON) film. The buffer film 300 may be omitted.

An oxide semiconductor layer 130 is formed on the buffer film 300. The oxide semiconductor layer 130 includes a first oxide semiconductor layer 131 and a second oxide semiconductor layer 132. The first oxide semiconductor layer 131 is a main channel layer in which electrons move, and is thus arranged close to the gate electrode 110. Therefore, the first oxide semiconductor layer 131 may be defined as a layer which is arranged closer to the gate electrode 110 than the second oxide semiconductor layer 132, and the second oxide semiconductor layer 132 may be defined as a layer which is arranged farther away from the gate electrode 110 than the first oxide semiconductor layer 131. For example, if the thin film transistor 100 is formed in the coplanar structure, as shown in FIGS. 18 and 19, the gate electrode 110 is arranged on the oxide semiconductor layer 130, and thus, the second oxide semiconductor layer 132 may be arranged on the first substrate 1110 or the buffer film 130 of the first substrate 1110 and the first oxide semiconductor layer 131 may be arranged on the second oxide semiconductor layer 132.

Further, a light blocking layer may be formed under the oxide semiconductor layer 130 so as to block light incident upon the oxide semiconductor layer 130 from the first substrate 1110.

A gate insulating film 120 is formed on the oxide semiconductor layer 130. The gate insulating film 120 may be formed as an inorganic film, for example, a silicon oxide ($SiO_x$) film, a silicon nitride ($SiN_x$) film or a multilayer film thereof.

The gate electrode 110 is formed on the gate insulating film 120. The gate electrode 110 is arranged to overlap the oxide semiconductor layer 130 with the gate insulating film 120 interposed therebetween. The gate electrode 110 may be formed in a monolayer or multilayer structure formed of at least one of molybdenum (Mo), aluminum (Al), chromium (Cr), gold (Au), titanium (Ti), nickel (Ni), neodymium (Nd), copper (Cu) or alloys thereof.

Although FIG. 19 exemplarily illustrates that the gate insulating film 120 is arranged only between the gate electrode 110 and the oxide semiconductor layer 130, the embodiments of the present invention are not limited thereto. That is, the gate insulating film 120 may be formed to cover the first substrate 1100 and the oxide semiconductor layer 130.

An interlayer insulating film 170 is formed on the gate electrode 110 and the oxide semiconductor layer 130. The interlayer insulating film 170 may be formed as an inorganic film, for example, a silicon oxide ($SiO_x$) film, a silicon nitride ($SiN_x$) film or a multilayer film thereof.

A first contact hole CT1 formed through the interlayer insulating film 170 to expose one side of the first oxide semiconductor layer 131 and a second contact hole CT2 formed through the interlayer insulating film 170 to expose the other side of the first oxide semiconductor layer 131 are formed in the interlayer insulating film 170.

The source electrode 140 and the drain electrode 150 are formed on the interlayer insulating film 170. The source electrode 140 contacts the one side of the first oxide semiconductor layer 131 through the first contact hole CT1. The drain electrode 150 contacts the other side of the first oxide semiconductor layer 131 through the second contact hole CT2.

A protective layer 160 is formed on the source electrode 140 and the drain electrode 150. The protective layer may be formed as an inorganic film, for example, a silicon oxide ($SiO_x$) film, a silicon nitride ($SiN_x$) film or a multilayer film thereof.

The first oxide semiconductor layer 131 may be formed of iron-indium-zinc oxide (FIZO) including iron (Fe), indium (In) and zinc (Zn) rather than indium-gallium zinc oxide (IGZO), in order to increase electron mobility.

Further, the resistance and band-gap energy of the second oxide semiconductor layer 132 may be greater than those of the first oxide semiconductor layer 131, and the band-gap energy of the second oxide semiconductor layer 132 may be within the range of 105% to 130% of the band-gap energy of the first oxide semiconductor layer 131. Concretely, a depletion region formed by a built-in potential due to a Fermi level difference between thin films is formed at a junction between the first oxide semiconductor layer 131 and the second oxide semiconductor layer 132, and the built-in potential causes band bending at the junction. The oxide semiconductor layer 130 has the depletion region and may thus control total charge density, thereby being capable of preventing the threshold voltage from shifting depending on the length of the channel.

That is, in one embodiment of the present invention, the charge density in the oxide semiconductor layer 130 formed as a thin film having high electron mobility may be effectively controlled by forming the second oxide semiconductor layer 132, and thus, a shift in the threshold voltage depending on a change in the length of the channel of the oxide semiconductor layer 130 may be prevented. As a result, one embodiment of the present invention may increase electron mobility and simultaneously ensure desirable characteristics of the thin film transistor. In order to perform a function of capping and protecting the first oxide semiconductor layer 131 so that the first oxide semiconductor layer 131 may stably function as a channel and to increase the etching rate of the second oxide semiconductor layer 132, the composition ratio of indium:gallium:zinc:tin in the second oxide semiconductor layer 132 may be different from the composition ratio of indium:gallium:zinc:tin in the first oxide semiconductor layer 131.

A method for forming the first oxide semiconductor layer 131 and the second oxide semiconductor layer 132 is the same as that described above with reference to FIGS. 5 to 13, and a detailed description thereof will thus be omitted.

As described above, the second oxide semiconductor layer 132 is formed of indium-gallium-zinc oxide (IGZO) including indium (In), gallium (Ga) and zinc (Zn), and may thus prevent threshold voltage from varying even if the oxide semiconductor layer 130 is formed as a short channel, and perform a function of capping and protecting the first oxide semiconductor layer 131 so that the first oxide semiconductor layer 131 may stably function as a channel.

Referring to FIGS. 12 and 13, the inclination of each of the side surfaces of the first oxide semiconductor layer 131 may be formed at the first angle θ1 which is an acute angle. The inclination of each of the side surfaces of the second oxide semiconductor layer 132 may be formed at the second angle θ2 which is a right angle, as shown in FIG. 12, or be formed at the third angle θ3 which is an acute angle, as shown in FIG. 13.

In more detail, the oxide semiconductor layer 130 may include the first oxide semiconductor layer 131 formed of iron-indium-zinc oxide (FIZO) including iron (Fe), indium (In) and zinc (Zn) and the second oxide semiconductor layer 132 formed of an oxide including at least one of indium (In), gallium (Ga) or zinc (Zn), or indium-gallium-zinc oxide (IGZO) including indium (In), gallium (Ga) and zinc (Zn).

As is apparent from the above description, a display device including a thin film transistor according to one embodiment of the present invention increases electron mobility and improves light reliability, thus being capable of being applied as a flat display device requiring high-speed driving at an ultra-high definition.

Further, pores are not formed at the boundary between a first oxide semiconductor layer and a second oxide semiconductor layer, and thereby, additional etching of the first oxide semiconductor layer and the second oxide semiconductor layer due to an etching solution penetrating into the pores may be prevented.

In addition, it is possible to prevent the first oxide semiconductor layer and the second oxide semiconductor layer from having a different channel length or channel width from that of a designed structure.

Moreover, deterioration of negative bias temperature illumination stress (NBIS) characteristics of the thin film transistor may be prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A thin film transistor comprising:
 a first oxide semiconductor layer of iron-indium-zinc oxide (FIZO); and
 a second oxide semiconductor layer of indium-gallium-zinc oxide (IGZO),
 wherein:
 a content ratio of iron (Fe) to indium (In) (Fe/In) is smaller than a content ratio of zinc (Zn) to indium (In) (Zn/In), in the first oxide semiconductor layer;
 a content of indium (In) is greater than a content of zinc (Zn), in the first oxide semiconductor layer; and
 the content of zinc (Zn) is greater than a content of iron (Fe), and smaller than the content of indium (In), in the first oxide semiconductor layer.

2. The thin film transistor according to claim 1, wherein:
an inclination of one side surface of the first oxide semiconductor layer is formed at an acute angle; and
an inclination of one side surface of the second oxide semiconductor layer is formed at a right angle or an acute angle.

3. The thin film transistor according to claim 1, wherein:
a content ratio of gallium (Ga) to indium (In) (Ga/In) in the second oxide semiconductor layer is greater than a content ratio of gallium (Ga) to indium (In) (Ga/In) in the first oxide semiconductor layer.

4. The thin film transistor according to claim 1, wherein:
a content ratio of zinc (Zn) to indium (In) (Zn/In) in the second oxide semiconductor layer is greater than a content ratio of zinc (Zn) to indium (In) (Zn/In) in the first oxide semiconductor layer.

5. The thin film transistor according to claim 1, wherein resistance and band-gap energy of the second oxide semiconductor layer are greater than resistance and band-gap energy of the first oxide semiconductor layer, and the band-gap energy of the second oxide semiconductor layer is within a range of 105% to 130% of the band-gap energy of the first oxide semiconductor layer.

6. The thin film transistor according to claim 1, further comprising a gate electrode closer to the first oxide semiconductor layer than to the second oxide semiconductor layer.

7. The thin film transistor according to claim 6, wherein the first oxide semiconductor layer overlaps the gate electrode with a gate insulating film interposed therebetween.

8. The thin film transistor according to claim 6, wherein:
the gate electrode is disposed under the first oxide semiconductor layer; and
the second oxide semiconductor layer is disposed on the first oxide semiconductor layer.

9. The thin film transistor according to claim 8, further comprising:
a source electrode configured to contact one side of the first oxide semiconductor layer and one side of the second oxide semiconductor layer; and
a drain electrode configured to contact the other side of the first oxide semiconductor layer and the other side of the second oxide semiconductor layer.

10. The thin film transistor according to claim 6, wherein:
the gate electrode is disposed on the first oxide semiconductor layer; and
the second oxide semiconductor layer is disposed under the first oxide semiconductor layer.

11. The thin film transistor according to claim 10, further comprising:
a source electrode configured to contact one side of the first oxide semiconductor layer through a first contact hole formed through an interlayer insulating film configured to cover the first oxide semiconductor layer and the second oxide semiconductor layer; and
a drain electrode configured to contact the other side of the first oxide semiconductor layer through a second contact hole formed through the interlayer insulating film.

12. The thin film transistor according to claim 11, wherein:
the source electrode contacts one side of the second oxide semiconductor layer through the first contact hole formed through the first oxide semiconductor layer; and
the drain electrode contacts the other side of the second oxide semiconductor layer through the second contact hole formed through the first oxide semiconductor layer.

13. The thin film transistor according to claim 1, wherein a thickness of the first oxide semiconductor layer is within a range of 50 Å to 300 Å.

14. A display device comprising:
a display panel comprising data lines, gate lines, and pixels arranged in intersection regions between the data lines and the gate lines,
wherein each of the pixels comprises a thin film transistor including a first oxide semiconductor layer of iron-indium-zinc oxide (FIZO) and a second oxide semiconductor layer of indium-gallium-zinc oxide (IGZO),
wherein a content ratio of iron (Fe) to indium (In) (Fe/In) is smaller than a content ratio of zinc (Zn) to indium (In) (Zn/In), in the first oxide semiconductor layer,
a content of indium (In) is greater than a content of zinc (Zn), in the first oxide semiconductor layer and
the content of zinc (Zn) is greater than a content of iron (Fe), and smaller than the content of indium (In), in the first oxide semiconductor layer.

15. The display device according to claim 14, wherein:
the display panel further comprises a gate driver configured to output gate signals to the gate lines; and
the gate driver includes at least one thin film transistor having the same structure as the thin film transistor in each of pixels.

16. The display device according to claim 15, wherein the gate driver further comprises a pull-up transistor, a pull-down transistor, and a plurality of transistors of a node controller.

17. The display device according to claim 14, wherein each of the pixels comprises a driving transistor and switching transistors.

18. A gate driver comprising:
a plurality of stages configured to output gate signals,
wherein each of the stages comprises a thin film transistor including a first oxide semiconductor layer of iron-indium-zinc oxide (FIZO) and a second oxide semiconductor layer of indium-gallium-zinc oxide (IGZO),
wherein a content ratio of iron (Fe) to indium (In) (Fe/In) is smaller than a content ratio of zinc (Zn) to indium (In) (Zn/In), in the first oxide semiconductor layer,
a content of indium (In) is greater than a content of zinc (Zn), in the first oxide semiconductor layer and
the content of zinc (Zn) is greater than a content of iron (Fe), and smaller than the content of indium (In), in the first oxide semiconductor layer.

* * * * *